United States Patent
Pileggi et al.

(12) 
(10) Patent No.: US 6,367,051 B1
(45) Date of Patent: Apr. 2, 2002

(54) SYSTEM AND METHOD FOR CONCURRENT BUFFER INSERTION AND PLACEMENT OF LOGIC GATES

(75) Inventors: Lawrence Pileggi, Pittsburgh, PA (US); Sharad Malik, Princeton, NJ (US); Emre Tuncer, Palo Alto, CA (US); Abhijeet Chakraborty, Sunnyvale, CA (US); Satyamurthy Pullela, Cupertino, CA (US); Altan Odabasioglu, Sunnyvale, CA (US); Douglas B. Boyle, Palo Alto, CA (US)

(73) Assignee: Monterey Design Systems, Inc., Sunnyvale, CA (US)

( * ) Notice: Subject to any disclaimer, the term of this patent is extended or adjusted under 35 U.S.C. 154(b) by 0 days.

(21) Appl. No.: 09/096,810

(22) Filed: Jun. 12, 1998

(51) Int. Cl.$^7$ ................................................ G06F 17/50
(52) U.S. Cl. ................................................ 716/2; 716/7
(58) Field of Search .................. 716/12, 2, 7

(56) References Cited

U.S. PATENT DOCUMENTS

| | | | |
|---|---|---|---|
| 4,593,363 A | 6/1986 | Burnstein et al. | 364/491 |
| 5,396,435 A | 3/1995 | Ginetti | 364/489 |
| 5,452,239 A * | 9/1995 | Dai | 716/12 |
| 5,638,291 A | 6/1997 | Li et al. | 364/490 |

* cited by examiner

Primary Examiner—Matthew Smith
Assistant Examiner—Thuan Do
(74) Attorney, Agent, or Firm—Skjerven Morrill MacPherson LLP; Jon W. Hallman

(57) ABSTRACT

A design tool for integrated circuits includes a placement tool which concurrently places logic gates and interconnect. In one embodiment, the logic gates are placed into bins and virtual buffers are inserted between logic gates mapped to different bins. Placement and interconnect wire lengths and densities are successively improved leading to removal of some buffers and actualization of the virtual buffers.

23 Claims, 3 Drawing Sheets

SYSTEM AND METHOD FOR CONCURRENT BUFFER INSERTION AND PLACEMENT OF LOGIC GATES

BACKGROUND OF THE INVENTION

1. Field of the Invention

The present invention relates to integrated circuit design tools. In particular, the present invention relates to design tools which optimize area, performance, and power for integrated circuits.

2. Discussion of the Related Art

The interconnection wiring ("interconnect") among circuit elements in an integrated circuit is expected to dominate signal delays and to limit achievable circuit density of an integrated circuit. Existing design methods, which treat interconnect as "parasitics" and focus on optimizing transistors and logic gates, are ill-equipped to provide a design which delivers the necessary performance. Typically, in a conventional design method, the circuit elements of an integrated circuit are first synthesized and placed. A routing tool is then used to interconnect these circuit elements. Interconnect signal propagation problems are identified during routing, when the interconnect dominates the delay. Because placement and routing are performed relatively independently, adding buffers and repeaters to correct these interconnect signal propagation problems identified during routing is a costly iterative process.

Various techniques have been applied to address signal propagation performance in an integrated circuit design. For example, U.S. Pat. No. 5,638,291, entitled "Method and Apparatus for Making Integrated Circuits by Inserting Buffers into a Netlist to Control Clock Skew" to Li et al., discloses modification of a net list to insert buffers into clock signal paths to control clock skew. As another example, U.S. Pat. No. 5,396,435, entitled "Automated Circuit Design System and Method for Reducing Critical Path Delay Times" to Ginetti, discloses modification to a logic circuit to reduce delays in a critical path of an integrated circuit. However, the effectiveness of these methods for increasing circuit performance is constrained by their inability to concurrently affect placement of circuit elements.

SUMMARY OF THE INVENTION

The present invention provides a method for mapping circuit elements of a net list onto a physical design. The method includes the steps of: (a) partitioning the physical design area into multiple bins; (b) mapping the circuit elements into the multiple bins; (c) inserting a buffer between each pair of connected circuit elements placed in bins more than a predetermined distance apart; (d) optimizing placements of the circuit elements and the buffers in the physical design by revising the mapping of the circuit elements and the buffers to the bins in accordance with a cost function; and (e) subdividing the bins and remapping circuit elements into the subdividing bins, while inserting or removing appropriately buffers and shielding buffers, where appropriate.

In one embodiment, the predetermined distance for buffer insertion is the minimum of either the distance at which the propagation delay of the buffer substantially equals the delay provided by an interconnect wire of a predetermined width over the distance, or the distance for which the signal attenuation exceed a predetermined value. In one application, a buffer is inserted concurrently with placement to both reduce the delay to a far away load and to shield the far away load from the nearby load. In another application, a buffer is inserted in a critical path both to reduce the delay in the critical path and to isolate the critical path from other loads on the same net.

The present invention can be used in conjunction with many design tools, including a placement tool which provides successively smaller bins for placement, and repeats optimizing placement and interconnect steps and buffer removing steps at every level of partitioning.

In one embodiment, until predetermined criteria are met, buffers inserted are held in a virtual buffer list outside of the input circuit net list. The buffer is incorporated into the net list when the distance between the pair of connected circuit elements interconnected by the inserted buffer exceeds a distance determined based on the current bin size. The buffer is removed from the virtual list when the pair of connected circuit elements become separated by less than a predetermined distance.

The present invention is applicable not only to conventional design with conventional interconnect, but also in design such as those with copper interconnect or design interconnected by RF transmission lines carrying high speed mixed mode signals. The present invention is also applicable to integrated systems design, such as design of a micromachine including electronic circuits.

DETAILED DESCRIPTION OF THE PREFERRED EMBODIMENTS

The present invention provides a method that inserts buffers concurrently with placement optimization. The buffers are inserted to avoid excessive signal attenuation and to reduce delay in the portion or portions of a net in a critical path, while allowing the remainder of the net to be freely routed.

The present invention can be applied to an integrated circuit design system, such as any of those disclosed in the copending patent applications ("Copending Applications"): (a) a patent application, entitled "Performance Driven Design Optimization Using Logical and Physical Information" by D. Boyle et al., Ser. No. 09/021,973, filed Feb. 11, 1998, and (b) a patent application, entitled "Method for Design Optimization Using Logical and Physical Information," by L. Pileggi et al., Ser. No. 09/097,299, filed on the same day as the present application. Both Copending Applications are assigned to Monterey Design Systems, Inc., which is also the Assignee of the present application. The disclosures of the Copending Applications are hereby incorporated by reference in their entireties.

Figure 1:
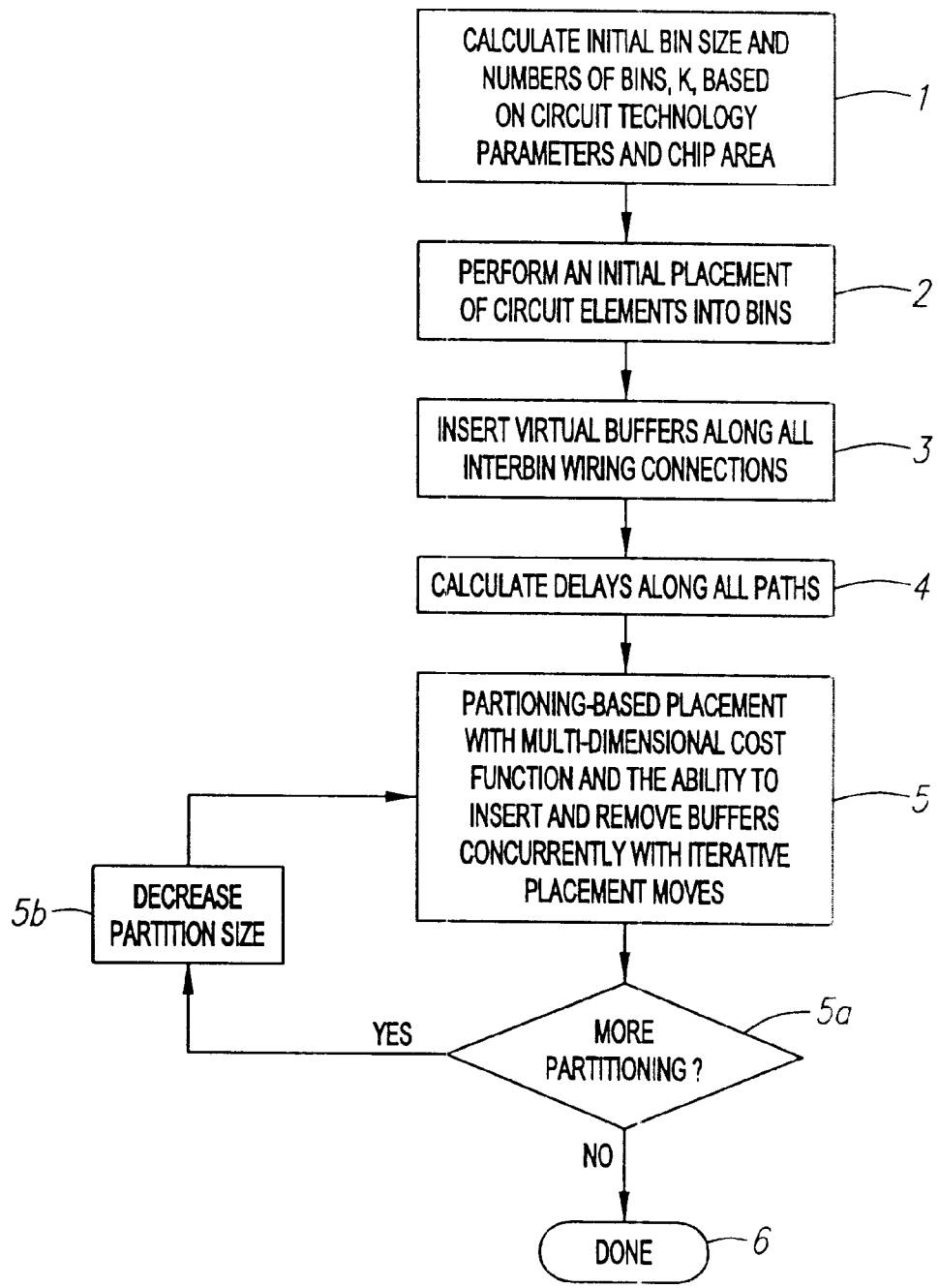
FIG. 1 is a flow diagram of a method of optimizing integrated circuit performance, in accordance with one embodiment of the present invention.

FIG. 1 is a flow diagram of a method for optimizing interconnect performance in accordance with one embodiment of the present invention. As shown in FIG. 1, at step 1, a value "k" is calculated to divide the chip area of the integrated circuit into k "bins". The value k is calculated based on the total available chip area, the expected RC delay characteristics of the interconnect technology and expected circuit element ("gate") delay characteristics. Typically, the RC delay characteristics depend on the resistance and the capacitance of the interconnect and the frequency of operation. The value "k" is a function of the minimum distance for which the propagation delay of a buffer is less than the RC delay of an interconnect wire of minimum width over the minimum distance.

Figure 2:
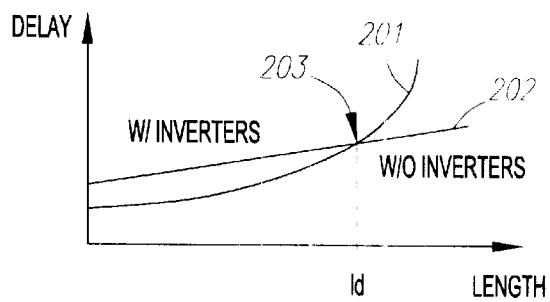
FIG. 2 is a delay versus interconnect length plot showing variations of the delay characteristics of an electrical node with different lengths of interconnect, with buffer insertion and without buffer insertion.

In this embodiment, a buffer can be implemented by two series-connected inverters (e.g., a minimum size input inverter driving an output inverter of twice minimum size). The delay characteristics for a net with buffer insertion and the same net without buffer insertion are illustrated in FIG. 2. Graph 201 of FIG. 2 shows, without buffer insertion, how delay varies in a net with interconnect length. Graph 202 shows, when a buffer is inserted, how delay varies with interconnect length. Point 203 indicates the length ld ("buffer threshold length") beyond which the RC delay of the interconnect exceeds the additional switching delay which would be incurred by inserting the buffer.

Figure 4A:
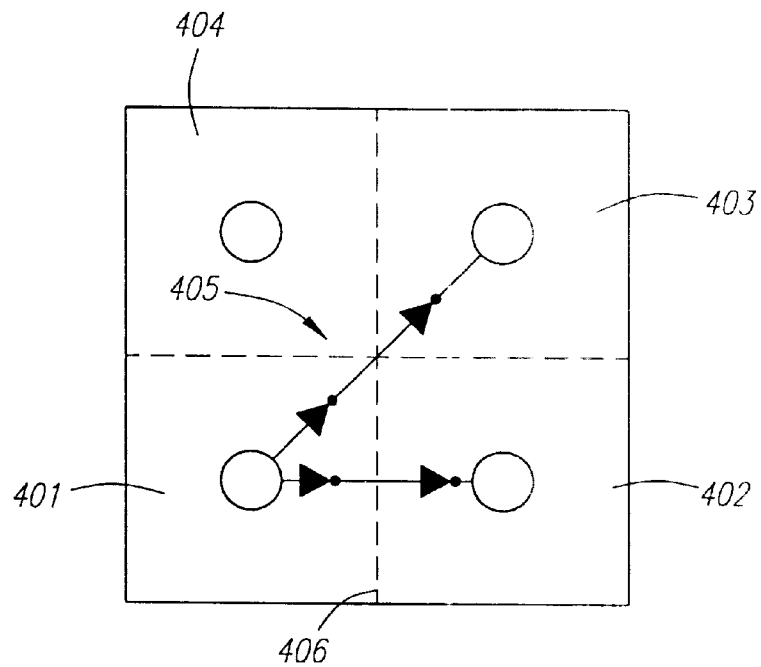
FIG. 4a illustrates insertions of virtual inverter pairs (VIPs) 405 and 406 among circuit elements in bins 401–403.

Using the calculated value "k", the chip area is divided into a 2-dimensional configuration of k bins. An input net list (e.g., a logic gate-level net list synthesized from a behavioral description of an integrated circuit or a portion of an integrated circuit) is received. The circuit elements of the net list are then clustered or grouped according to a floor plan. The circuit elements are then assigned each to a bin, with each circuit element being mapped to a single point (e.g., a center point) within the bin. In one embodiment, the clustered circuit elements are assigned each to a bin until the bin reaches its maximum gate capacity and the remaining unassigned circuit elements connected to the assigned circuit elements are then assigned to the next available adjacent bin. This procedure repeats until all circuit elements of the net list are assigned.

Where a connection exists between two circuits elements mapped into two different bins at this level of partitioning, one or more "virtual buffers" are inserted between the circuit elements. Since the circuit elements could eventually be placed within a distance of each other over which buffering is not necessary, at this stage of processing, the virtual buffers are not actualized by a modification to the input net list. Rather, each virtual buffer is kept on a "virtual list" until a subsequent evaluation indicates that the virtual buffer should be actualized and included into the net list. However, for timing purposes, each virtual buffer is treated as if it is actually included into the net list. In this embodiment, a virtual buffer can be implemented by a pair of series-connected inverters, referred to as a virtual inverter pair or "VIP". FIG. 4a shows insertions of VIPs 405 and 406 among circuit elements mapped into bins 401–403.

At step 4, having mapped all circuit elements into bins, delays for each net is calculated. Since circuit elements within a bin are placed at the center point, a statistical estimate of delay is provided for each net within a bin. Such a statistical estimate of delay can be provided, for example, based on the fan-out at a driver of the net. A delay based on estimate of the resistance and capacitance in a net ("RC calculations") can be provided for a net between circuit elements of different bins. Where a net has a non-negligible portion of delay within a bin and a non-negligible portion of delay between bins, an estimate based on both the statistical estimate of delay and the RC calculations can be provided. In this embodiment, the expected performance at each net is represented by a "slack graph", i.e., the slack at each net is represented by the time difference between the arrival time and the required time of a signal on the net. The propagation delay of any logic gate can be estimated by conventional techniques, such as using Thevenin equivalent or effective load ($C_{eff}$) models.

At step 5, a placement algorithm provides placement of circuit elements, based on minimizing a cost function. In this embodiment, the cost function has congestion, gate area, total wiring, power and delay components. One example of a suitable placement algorithm is the Fidduccia-Matheyses (FM) algorithm known in the art. Under the FM algorithm, circuit elements are exchanged among bins to reduce the overall cost function.

In the present embodiment, the placement is refined through iterations. As part of every iteration, the bins of the previous iteration are further partitioned recursively into smaller bins, with the circuit elements of a bin in a previous iteration being redistributed into the smaller bins in the current iteration The present invention also inserts a buffer or repeater when insertion of such a buffer (a) provides both additional drive to reduce the propagation delay to a far away load, and shielding to reduce the delay to a nearby load; or (b) reduces the delay to a nearby load on a critical path. The inserted buffer shields the nearby load from the capacitive load of the interconnect to a far away load. Buffer insertion based on these criteria can be performed as part of each placement iteration, when circuit elements are exchanged among bins. The delay or slack graphs are incrementally updated so that virtual buffers can be inserted or removed concurrently with placement.

Figure 3A:
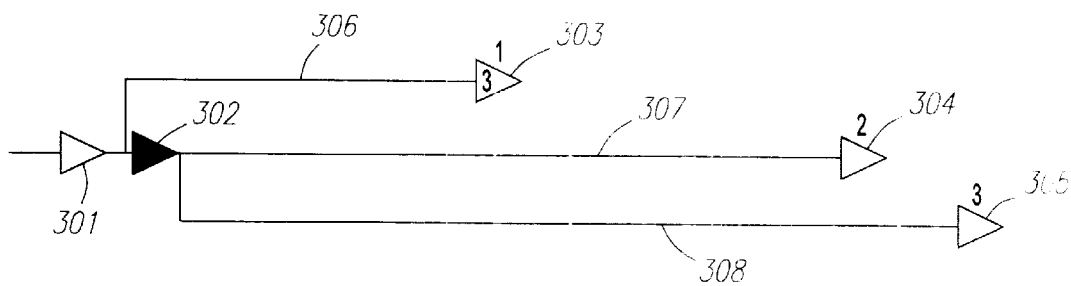
FIG. 3a provides an exemplary circuit in which insertion of a buffer reduces delay to a circuit element in a critical path.

FIG. 3a illustrates buffer insertion which reduces the delay in a critical path. As shown in FIG. 3a, gate 301 initially drives the input terminals of gates 303, 304 and 305 over the interconnect portions 306, 307 and 308 respectively, prior to insertion of buffer 302. Assuming that gates 301 and 303 are in a critical path, with insertion of buffer 302, gate 301 drives only the input terminals of buffer 302 and gate 303. Consequently, the interconnect portions 307 and 308 no longer loads the output driver of gate 301, thereby improving the delay in the critical path of gates 301 and 303, while allowing a placement tool to freely move and place gates 304 and 305 without regard to the delay in the critical path of gates 301 and 303.

Figure 3B:
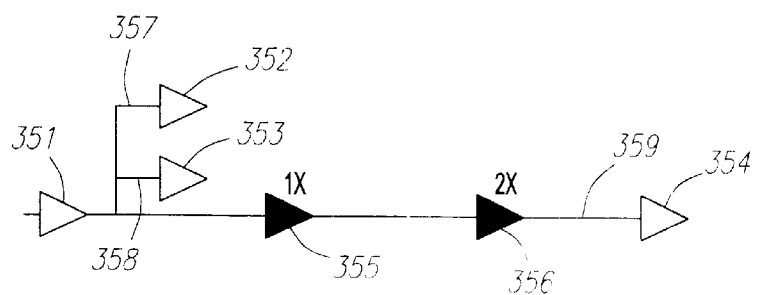
FIG. 3b provides an exemplary circuit in which insertion of a buffer reduces delays to both a far away load and nearby loads.

FIG. 3b illustrates buffer insertion which reduces the delays to both a far away load and a nearby load. As shown in FIG. 3b, gate 351 initially drives the input terminals of gates 352, 353 and 354 over interconnect portions 357, 358 and 359, prior to insertion of the buffer represented by inverters 355 and 356. Interconnect portion 359 has a length which exceeds the value "ld" for the given RC technology. With insertion of the buffer, gate 351 drives only the input terminals of inverter 355 and gates 352, 353, thereby shielding gate 351 from interconnect portion 359. Consequently, the delay to gates 352 and 353 are reduced. In addition, because of the buffer insertion, the delay to gate 354 is also reduced, since interconnect portion 359 has a length exceeding ld. Thus, insertion of the buffer including inverters 355 and 356 reduces the delays to both the far away load at gate 354 and the nearby loads at gates 352 and 353.

Figure 4B:
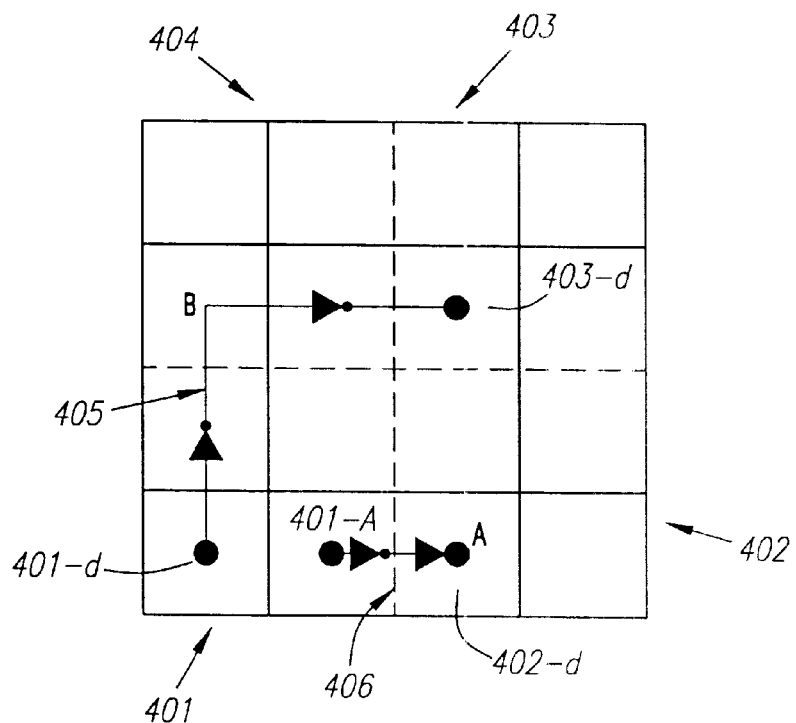
FIG. 4b illustrates actualizing VIP 405 and removal of VIP 406 of FIG. 4a, after the bins are further subdivided at the next level of partition.

FIG. 4b illustrates actualizing VIP 405 and removal of VIP 406 of FIG. 4a. As shown in FIG. 4b, after a placement iteration, bins 401–404 are each partitioned into four smaller bins (401a–401d, 402a–402d, 403a–403d and 404a–404d). Consequently, VIPs 405 and 406 are interconnecting circuit elements of bins 401d and 403d (Path B), and circuit elements of bins 401a and 402d (Path A), respectively. Since Path A is now much shorter than the buffer threshold length ld, VIP 406 can be removed to reduce delay. (If the circuit elements connected in Path A are placed apart again in subsequent cycles, a VIP can be reinserted at the appropriate time). For the long wires, e.g., Path B of VIP 405, their virtual buffers are each actualized by including a pair of series-connected inverters into the net list. Actualizing VIPs in long wires avoids excessive delay and congestion ambiguities in these signal paths. Because of the nature of a partition-based placement algorithm, buffers actualized are unlikely to become unnecessary in subsequent placement variations.

When the current level of partitioning yields bins smaller than a predetermined size, no further partitioning takes place. Instead, a detailed placement algorithm, such as conventional cool-annealing cycles, can be used to provide final placement of circuit elements of each bin.

The above detailed description is provided to illustrate the specific embodiments above and is not intended to be limiting of the present invention. Numerous variations and modifications within the scope of the present invention are possible. For example, the present invention is applicable to not only to design of logic circuits with conventional signaling on conventional interconnects, but to design of other circuit technologies also, such as high speed mixed mode signals on RF transmission lines, or circuits using copper interconnect. The present invention can also provide system useful not only in the design of electronic integrated circuits, but also to micromachines with a significant electronic circuit portions. The present invention is set forth in the following claims.

What is claimed is:

1. A method for mapping circuit elements of a net list onto a target area of a semiconductor surface, comprising:
   partitioning said target area into a plurality of bins;
   mapping said circuit elements into said bins;
   inserting a buffer between each pair of connected circuit elements placed in bins more than a predetermined distance apart;
   optimizing said mapping of said circuit elements in accordance with a cost function, while concurrently inserting and removing buffers when said buffers are mapped into bins based on an insertion criterion and a removal criterion, respectively; and
   subdividing said bins into smaller bins, and repeating said optimizing step.

2. A method as in claim 1, wherein said predetermined distance being the distance at which the propagation delay of said buffer substantially equals the delay provided by an interconnect wire of a predetermined width over said distance.

3. A method as in claim 1, wherein each cost estimate of a signal path takes into consideration signal transit time between circuit elements in said signal path.

4. A method as in claim 1, further comprising the step of inserting a buffer when such a buffer both reduces the delay to a far away load and shields the far away load from the nearby load.

5. A method as in claim 1, further comprising the step of inserting a buffer in a critical path when the buffer reduces the delay in said critical path.

6. A method as in claim 1, further comprising inserting a shielding buffer, where a logic gate drives more than a predetermined capacitance related to input terminals of other circuit elements.

7. A method as in claim 1, further comprising dividing said bins in successively smaller bins and repeating said optimizing and removing steps upon said smaller bins.

8. A method as in claim 1, wherein said inserting step places said buffer in a list outside of said net list.

9. A method as in claim 8, wherein said buffer is incorporated into said net list when the distance between said pair of connected circuit elements exceed a predetermined distance.

10. A method as in claim 1, wherein said buffer is removed when said pair of connected circuit elements are separated by less than a predetermined distance.

11. A system for mapping circuit elements of a net list onto a target area of a semiconductor surface, comprising:
    a partitioner for partitioning said target area into a plurality of bins each having a predetermined size, and for mapping said circuit elements into said bins;
    means for inserting a buffer between each pair of connected circuit elements placed in bins more than a predetermined distance apart; and
    a placement tool which optimizes said mapping of said circuit elements in accordance with a cost function, while concurrently inserting and removing buffers when said buffers are mapped into bins based on an insertion criterion and a removal criterion, respectively, wherein said placement tool subdivides said bins into smaller bins as said mapping of said circuit elements is optimized.

12. A system as in claim 11, wherein said predetermined distance being the distance at which the propagation delay of said buffer substantially equals the delay provided by an interconnect wire of a predetermined width over said distance.

13. A system as in claim 11, wherein each cost estimate of a signal path takes into consideration signal transit time between circuit elements in said signal path.

14. A system as in claim 11, said means for inserting a buffer inserts said buffer when such a buffer both reduces the delay to a far away load and shields the far away load from the nearby load.

15. A system as in claim 11, wherein said means for inserting inserts a buffer in a critical path when the buffer reduces the delay in said critical path.

16. A system as in claim 11, said means for inserting further inserts a shielding buffer where a logic gate drives more than a predetermined capacitance related to input terminals of other circuit elements.

17. A system as in claim 11, wherein said partitioner further divides said bins into successively smaller bins and repeatedly invoking said placement tool to place said circuit elements and buffers into said smaller bins.

18. A system as in claim 11, wherein said means for inserting places said buffer in a list outside of said net list.

19. A system as in claim 18, wherein said buffer is incorporated into said net list when the distance between said pair of connected circuit elements exceed a predetermined distance.

20. A system as in claim 11, wherein said buffer is removed when said pair of connected circuit elements are separated by less than a predetermined distance.

21. A system as in claim 11, wherein said circuit elements are interconnected by copper.

22. A system as in claim 11, wherein said circuit elements are interconnected via RF transmission lines carrying high speed mixed mode signals.

23. A system as in claim 11, wherein said target area comprises a micromachine including electronic circuits.

* * * * *